United States Patent [19]

Kamimura et al.

[11] Patent Number: 4,772,565
[45] Date of Patent: Sep. 20, 1988

[54] METHOD OF MANUFACTURING SOLID-STATE IMAGE SENSOR

[75] Inventors: Takaaki Kamimura, Kawasaki; Hidetoshi Nozaki; Masahiko Hirose, both of Yokohama, all of Japan

[73] Assignee: Kabushiki Kaisha Toshiba, Kawasaki, Japan

[21] Appl. No.: 51,590

[22] Filed: May 20, 1987

[30] Foreign Application Priority Data

May 21, 1986 [JP] Japan .................... 61-116657
Jul. 15, 1986 [JP] Japan .................... 61-166019

[51] Int. Cl.$^4$ ............... H01L 27/14; H01L 31/02
[52] U.S. Cl. .................... 437/004; 437/100; 437/101; 437/937
[58] Field of Search ............ 437/4, 100, 101, 937, 437/946

[56] References Cited

U.S. PATENT DOCUMENTS

| 4,348,428 | 9/1982 | Rockley et al. | 427/54.1 |
| 4,544,423 | 10/1985 | Tsuge et al. | 437/101 |
| 4,581,249 | 4/1986 | Kamiya | 427/53.1 |
| 4,654,226 | 3/1987 | Jackson et al. | 427/54.1 |

OTHER PUBLICATIONS

Inoue et al., Appl. Phys. Lett. 44 (9), 1 May 1984, pp. 871–873.
IEEE Trans. Electron Devices ED-32,8, p. 1499; N. Harada et al., Aug. 8, 1985.
IEEE Trans. Electron Devices ED-32,8, p. 1495; T. Chikamura et al., Aug. 8, 1985.

Primary Examiner—Olik Chaudhuri
Attorney, Agent, or Firm—Oblon, Fisher, Spivak, McClelland & Maier

[57] ABSTRACT

A method of manufacturing a solid-state image sensor comprises the steps of preparing a solid-state image sensor substrate in which a signal charge storing diode and a signal charge readout section are formed and forming, as a photoelectric conversion section, a photoconductive film having an amorphous silicon film on the substrate. The amorphous silicon film is formed by introducing a source gas containing silicon compounds on the substrate and decomposing the source gas by radiating ultraviolet light on the source gas while the solid-state image sensor substrate is kept at a temperature of 100° to 350° C.

10 Claims, 2 Drawing Sheets

METHOD OF MANUFACTURING SOLID-STATE IMAGE SENSOR

BACKGROUND OF THE INVENTION

The present invention relates to a method of manufacturing a multi-layers type solid-state image sensor obtained by stacking a photoconductive film on a substrate provided with solid-state image sensor.

A two-layered solid-state image sensor obtained by stacking a photoconductive film on a solid-state image sensor substrate has good characteristics of high sensitivity and low level of image smear. Thus, the solid-state image sensor of this type is promising for use in cameras of various types of TV monitors or high-definition TVs. An amorphous silicon film is often used as a photoconductive film for a solid-state image sensor of this type, and a silane glow discharge decomposition method is generally used as a method of depositing the amorphous film (e.g., refer to N. Harada et al. IEEE Trans. Electron Devices Vol. ED-32, No. 8 (1985) p. 1499).

However, a method of manufacturing a two-layered image sensor by the amorphous silicon film deposition method using the glow discharge decomposition method has the following problems. More specifically, since this method uses plasma for decomposing a source gas, many charged particles are present in a gas phase and damage the obtained film, thus degrading the characteristics of the film. As a result, in a solid-state image sensor which uses an amorphous silicon film as a photoelectric conversion layer, the image lag characteristics resulting from the amorphous silicon film are degraded due to the degradation in the quality of the amorphous silicon film or the interface characteristics.

Assume that a structure wherein a p-type amorphous silicon carbon film is provided as a barrier layer on an i-type amorphous silicon film, i.e., a p-type a-SiC/i-type a-Si structure is adopted as the structure of the photoconductive film having an amorphous silicon film. When such a structure is formed by the glow discharge decomposition method, the interface characteristics between the films of the composite film comprising the p-type a-SiC/i-type a-Si structure are degraded. As a result, recombination of electrons and holes generated by light incidence tends to occur at the interface, and the sensitivity in a blue region which is absorbed in the vicinity of the surface is decreased.

In order to solve such a problem of interface characteristics, a method to include a graded region, wherein the carbon content is continuously changed, in the a-SiC/a-Si interface is also proposed. However, this method makes the process control difficult and eventually degrades the image-lag characteristics.

SUMMARY OF THE INVENTION

It is an object of the present invention to provide a method of manufacturing a multi-layers type solid-state image sensor which has good image lag characteristics and in which the sensitivity of the blue region may not be degraded even if a p-type SiC/a-Si photoconductive film is used.

The present invention is characterized in that, in a method of manufacturing a solid-state image sensor for stacking an amorphous Si (a-Si) film as a photoconductive film, the a-Si film is deposited by a photochemical vapor deposition method.

According to the method of the present invention, since the a-Si film is deposited with only a radical reaction wherein no charged particles are present in a gas phase, damage is small and film quality and interface characteristics are improved. As a result, the image lag characteristics resulting from the photoconductive film are improved. In particular, when a p-type a-SiC/i-type a-Si structure is employed, its interface characteristics are improved, thereby increasing the sensitivity in the blue region.

DETAILED DESCRIPTION OF THE PREFERRED EMBODIMENTS

The preferred embodiments of the present invention will be described in detail with reference to the accompanying drawings.

Figure 1:
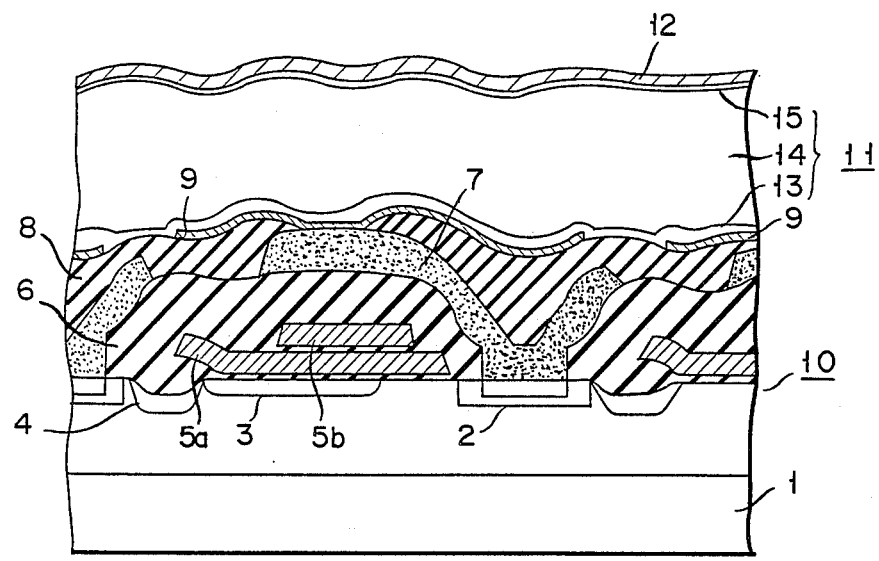
FIG. 1 is a sectional view of a CCD image sensor manufactured by a method according to an embodiment of the present invention.

FIG. 1 is a sectional view of a multi-layers type solid-state image sensor manufactured by a method according to an embodiment of the present invention. A plurality of n+-type layers 2 are formed in p well/p+ silicon crystalline substrate 1. As a result, a plurality of diodes for storing signal charges are formed in a matrix manner by substrate 1 and n+-type layers 2. Vertical CCDs 3 each comprising an n+-type buried channel CCD are formed in substrate 1 adjacent to the rows of the storing diodes. Reference numeral 4 denotes a p+-type layer as a channel stopper. A set of a storing diode row and a vertical CCD of the same structure is repeatedly formed and the sets are separated by p+-type layers 4. Reference numerals 5a and 5b denote transfer gate electrodes of vertical CCD 3. Parts of electrodes 5a serve as the charge transfer gate electrodes from layer 2 of the storing diode to the CCD channel. First interlayer insulating film 6 made of silicon dioxide is formed on substrate 1 to cover electrodes 5a and 5b. A contact hole corresponding to the storing diode is formed through insulating film 6. First electrode 7 is formed in the contact hole and the periphery of the contact hole on film 6. Electrode 7 is independently arranged for each pixel. First electrode 7 is formed by an Al-Si film, an n+-type polycrystalline silicon film, or the like. Second interlayer insulating film 8 of polyimide, PSG, BPSG, or the like is formed on first interlayer insulating film 6 and first electrode 7 in order to compensate for the gap therebetween. Second electrode 9 independent for each pixel is formed on second film 8 so as to contact first electrode 7 through a hole formed on film 8. Second electrode 9 is formed by, e.g., an Al-Si, Ti, Mo, Cr, or n+-type polycrystalline silicon film, or the like. In this manner, CCD image sensor substrate 10 is formed.

Amorphous silicon (a-Si) photoconductive layer 11 is deposited on the surface of CCD image sensor substrate 10, and transparent electrode 12 made of indium-tin-oxide (ITO) or the like is formed thereon, thereby constituting a multi-layer type CCD image sensor. In this embodiment, photoconductive layer 11 consists of three layers of i-type a-SiC film 13, i-type a-Si film 14, and p-type a-SiC film 15 deposited in this order from the substrate side.

A practical method for depositing three-layered a-Si photoconductive layer 11 by a photochemical vapor deposition method according to the embodiment of the present invention will be described.

Figure 2:
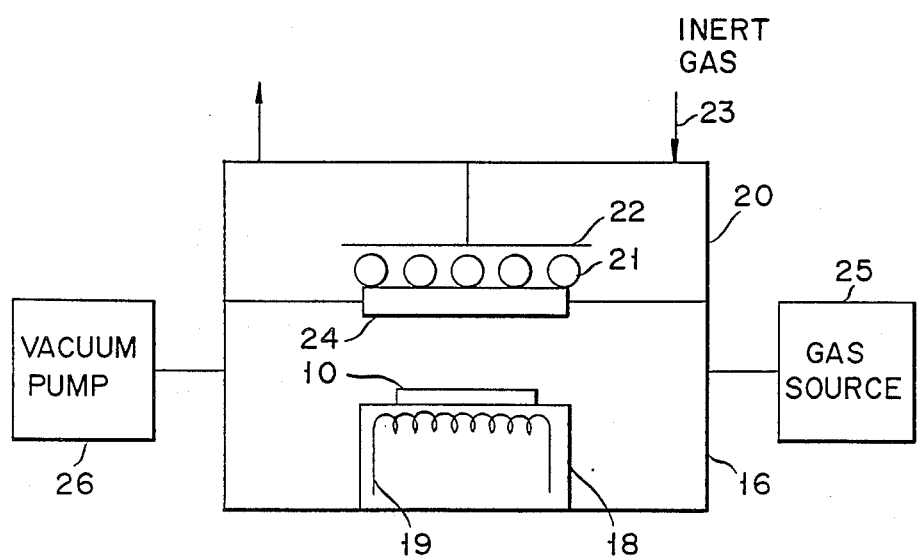
FIG. 2 is a schematic diagram of an a-Si film depositing apparatus used in the embodiment.
Figure 4:
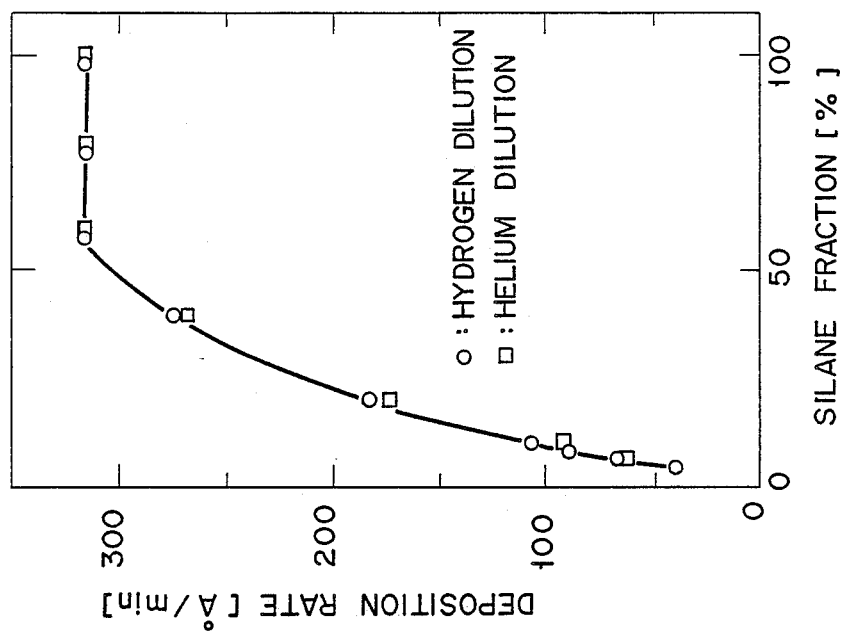
FIG. 4 shows a graph indicating the relationship between the silane fraction in a source gas and the deposition rate of amorphous silicon.

FIG. 2 shows a schematic arrangement of a photochemical vapor deposition apparatus (J. Appl. Phys. 58(a), 1 Nov. 1985) used in this method. This arrangement will be described. Referring to FIG. 2, reference numeral 16 denotes a film depositing chamber. Sample table 18 for placing CCD image sensor substrate 10 as a sample is housed in chamber 16. Heater 19 for heating the sample is provided inside table 18. Lamp housing 20 is provided on chamber 16. Light source 21 comprising, e.g., a plurality of low-pressure mercury lamps, and reflecting plate 22 for reflecting the light from light source 21 toward substrate 10 are provided in housing 20. Inert gas line 23 is connected to housing 20 and purges in the housing 20 with an inert gas. Light-transmitting window 24 is formed in a partition wall between chamber 16 and housing 20, and light from light source 21 radiates sample substrate 10 through it. Gas source 25 is connected to chamber 16 through a pipe, and a source gas is supplied from it to chamber 16. Evacuation pump 26 is connected to chamber 16 to evacuate in the chamber 16.

A method for depositing a-Si photoconductive film 11 by using the above film depositing apparatus and a pre-treatment of the substrate by using atomic hydrogen which is performed prior to the film formation, will be described.

Substrate 10 is placed on sample table 18. Heater 19 is turned on to keep substrate 10 at about 200° C. In this state, a hydrogen gas of about 10 sccm containing a small amount of mercury is introduced in film depositing chamber 16 from gas source 25, and the interior of chamber 16 is kept at a gas pressure of about 0.3 Torr. The gas flow rate is preferably set within a range of 1 and 100 sccm. And the gas pressure is preferably set within a range of 0.1 to 10 Torr. Light source 21 is turned on to irradiate the upper surface of substrate 10 with ultraviolet light for about 30 minutes, thereby performing atomic hydrogen treatment of the upper surface. The atomic hydrogen treatment time is preferably set within a range of 5 and 100 minutes. In the pre-treatment using such a mercury-sensitizing method, since the resonance lines of the low-pressure mercury lamp are 185 nm and 254 nm, when the hydrogen gas is allowed to photochemically react with such a low energy, the hydrogen gas is not ionized. Therefore, unlike in RF or DC glow discharge, the substrate is not sputtered by $H^+$, $H_2^+$, or the like. As a result, the insulating film on the surface of the solid-state image sensor substrate will not be sputtered to attach to the surface of a pixel electrode, or may not be included as a contaminant in a photoconductive film which is later formed, and a clean pixel electrode surface reduced by the atomic hydrogen can be obtained.

After pre-treatment is performed in the above manner, film depositing chamber 16 is evacuated to about $10^{-6}$ Torr, monosilane ($SiH_4$) and acetylene ($C_2H_2$) gases as source gases, mercury vapor, and a helium (He) gas as a dilution gas are introduced in film depositing chamber 16, and the pressure in chamber 16 is set to about 1 Torr. Subsequently, sample substrate 10 is heated to about 200° C., and light source 21 comprising low-pressure mercury lamps is turned on to irradiate the surface of sample substrate 10 with ultraviolet light having wavelengths of 254 nm and 185 nm. As a result, the source gas is photochemically dissociated and i-type a-SiC film 13 is deposited. This step is not always necessary but a next step can be directly performed on the substrate.

Film forming chamber 16 is evacuated to about $10^{-6}$ Torr, and a monosilane gas, as a source gas, and mercury vapor are introduced to chamber 16 at about 0.3 Torr. Low-pressure mercury lamp 21 is turned on for about two hours, thereby depositing i-type a-Si film 14 on i-type a-SiC film 13 (or on substrate 10 when film 13 is not deposited) to a thickness of about 1 to 3 $\mu$m. Finally, monosilane and acetylene gases as the source gases, a diborane ($B_2H_6$) gas as the doping gas, a helium gas as the dilution gas, and mercury vapor are introduced into chamber 16 at a pressure of 1 Torr, and light source 21 is turned on for about 1 to 2 minutes, thereby depositing p-type a-SiC film 15 on i-type a-Si film 14 to a thickness of about 100 to 200 Å by the photochemical vapor deposition method.

When the photoconductive image lag of the CCD image sensor device manufactured by this embodiment, in which a-Si photoconductive layer 11 is deposited, was measured, it was about 1.0% after 3 fields. When a similar layered structure is formed by a conventional glow discharge decomposition method, the photoconductive image lag after 3 fields is 5 to 10%. In contrast to this, according to this embodiment, the photoconductive image lag is greatly reduced to about 1/5 or less. The blue sensitivity was increased to about 1.5 times at a wavelength of 450 nm compared to a case when a glow discharge decomposition method was utilized, and was thus greatly improved.

Figure 3:
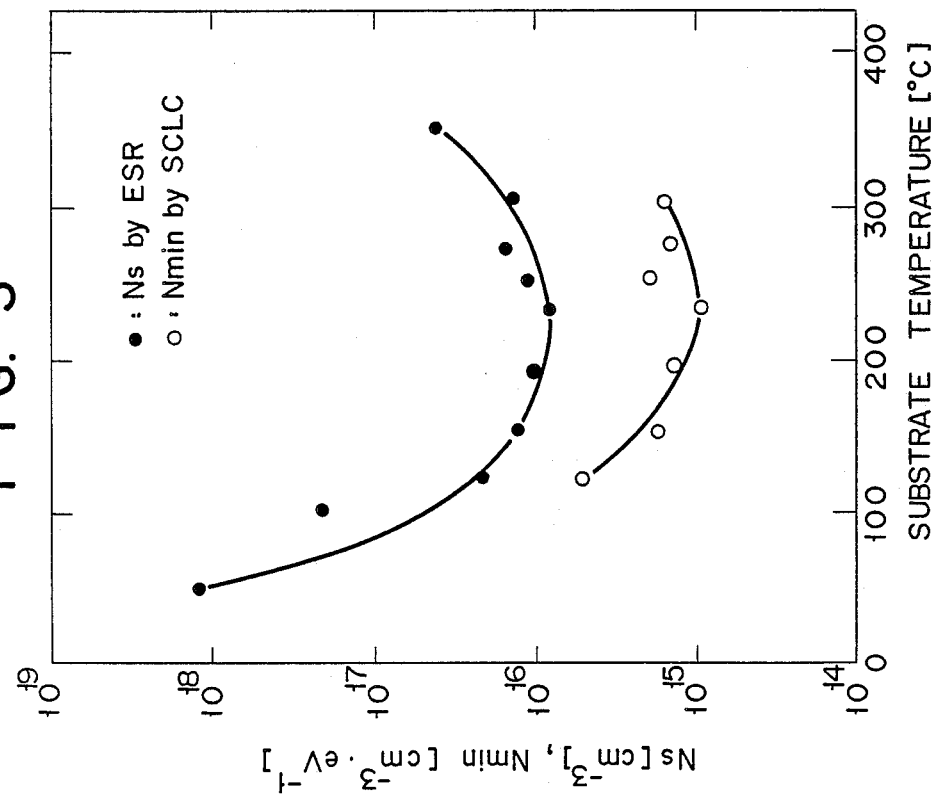
FIG. 3 shows a graph indicating the result obtained by measuring the relationship between the a-Si film characteristics and substrate temperatures.

In a-Si photoconductive layer 11 shown in FIG. 1, when the density of states and Si dangling bond density of, in particular, i-type a-Si film 14, are large, the photoconductive image lag is increased. FIG. 3 shows results obtained when the substrate temperature dependencies of the Si dangling bond density (Ns) and the minimum value (Nmin) of the density of states near the Fermi-levo, of an i-type a-Si film (film thickness of about 1 $\mu$m) deposited by the photochemical vapor deposition method described above were measured. The respective densities were measured by an electron spin resonance (ESR) method and a space charge limited current (SCLC) method. The results show that, in the substrate temperature range of 100° to 350° C., Ns and Nmin are $2 \times 10^{17}/cm^3$ or less and $5 \times 10^{16}/cm^3 \cdot eV$ or less, respectively, and a good film is formed. Excluding this range both Ns and Nmin are greatly increased. Therefore, when an i-type a-Si film is formed in the present invention by using the photochemical vapor deposition method, the substrate temperature is preferably set within a range of 100° and 350° C., more preferably 150° and 300° C., and most preferably 170° and 270° C.

In the present invention, the pressure in the film depositing chamber when the a-Si photoconductive layer is deposited by the photochemical vapor deposition method is preferably set within the range of $1 \times 10^{-2}$ and 10 Torr. When the pressure is less than $1 \times 10^{-2}$, the film deposition rate is greatly decreased since the source gas concentration is decreased. When the pressure is more than 10 Torr, the film tends to attach to the light-transmitting window, thereby greatly decreasing the deposition rate. The concentration of silicon compounds in the source gas in this case is preferably 60% or more in order to increase the deposition rate of the amorphous silicon. When the thickness of the a-Si photoconductive layer is decreased, its capacitance is increased, and the capacitive image lag is increased. For this reason, the film thickness of the a-Si photoconductive layer must be 1 μm or more and preferably 2 μm or more. When this point is considered, a pressure for providing a sufficiently high deposition rate must be selected. If the thickness of the a-Si photoconductive layer is too large, the image lag characteristics are degraded. Therefore, the film thickness is preferably 10 μm or less.

The present invention is not limited to the above embodiment. For example, when a disilane (Si$_2$H$_6$) gas is used as the main source gas and a low-pressure mercury lamp emitting light having a wavelength of, e.g., 1849 Å is used, an a-Si photoconductive layer can be deposited by the photochemical vapor deposition method and not by the mercury-sensitized method. Light from a rare gas (Xe, Kr, Ar, and so on) or hydrogen microwave discharge can be used as the light source, and monosilane or disilane can be used as the source gas, thereby depositing an a-Si photoconductive layer by the photochemical vapor deposition method. In the photochemical vapor deposition method, a deuterium lamp or ultraviolet laser can be used as the light source. The conditions such as the source gas flow rate or the mercury vapor saturator temperature can be arbitrarily set in accordance with the required film thickness and film quality.

A CCD image sensor substrate is used in the above embodiment. However, the present invention can be similarly applied when an a-Si photoconductive layer is formed on an MOS or BBD image sensor substrate. The structure of the a-Si photoconductive layer is not limited to that of the embodiment. For example, an i-type a-Si/p-type SiC layered structure can be used.

Various changes and modifications can be made within the spirit and scope of the invention.

As described above, according to the present invention, an a-Si photoconductive layer of a layered type solid-state image sensor is formed on a substrate by a photochemical vapor deposition method. Therefore, the film quality and the interface characteristics of the photoconductive layer are improved, and the image lag resulting from the photoconductive layer can be greatly reduced compared to a conventional case.

What is claimed is:

1. A method of manufacturing a solid-state image sensor, comprising the steps of:
   preparing a solid-state image sensor substrate provided with a signal charge storing diode and a signal charge readout section; and
   forming, as a photoelectric conversion section, a photoconductive film having an amorphous silicon film on the substrate,
   the improvement in which the amorphous silicon film is deposited by introducing a source gas set at a pressure set at $1 \times 10^{-2}$ to 10 Torr and containing mercury vapor and silicon compounds of 60 vol. % or more concentration on the substrate and decomposing the source gas by radiating ultraviolet light having a wavelength of 1000 to 3000 Å on the source gas while the solid-state image sensor substrate is kept at a temperature of 150° to 270° C.

2. A method according to claim 1, wherein said ultraviolet light is 254 nm and 185 nm in wavelength.

3. A method according to claim 1, wherein said amorphous silicon film is formed on an electrode made of titanium which is formed on said substrate.

4. A method according to claim 1, wherein said amorphous silicon film is formed on a BPSG layer of said substrate.

5. A method according to claim 1, wherein said amorphous silicon film consists of an i-type a-SiC film, i-type a-Si film and p-type a-Sic film which are formed in this order relative to the substrate.

6. A method of manufacturing a solid-state image sensor comprising the steps of:
   holding, in a film depositing chamber, a solid-state image sensor substrate provided with a signal charge storing diode and a signal charge readout section;
   treating the surface of the solid-state image sensor substrate by atomic hydrogen;
   supplying a source gas containing silicon compounds to said film depositing chamber after said treating step; and
   radiating light on one surface of the substrate for a predetermined period of time, thereby depositing a photoconductive amorphous silicon film by a photochemical method.

7. A method according to claim 6, wherein the surface treatment step has the steps of:
   supplying a hydrogen gas of a pressure within the range of 0.1 to 10 Torr into said film depositing chamber holding a substrate therein; and
   radiating light onto the hydrogen gas, thereby converting the hydrogen gas to atomic hydrogen.

8. A method according to claim 7, wherein the light for converting the hydrogen gas to the atomic hydrogen and decomposing the source gas is supplied from the same light source.

9. A method according to claim 6, wherein a time period of said step of treating the surface is 5 to 100 minutes.

10. A method of manufacturing a solid-state image sensor, comprising the steps of:
    treating the surface of a solid-state image sensor substrate provided with a signal charge storing diode and a signal charge readout section by producing atomic hydrogen in accordance with a mercury-sensitized method; and
    forming a photoconductive layer on the treated surface of the substrate by depositing an amorphous silicon film by a mercury-sensitized photochemical method.

* * * * *